US011755350B2

(12) United States Patent
Mondello et al.

(10) Patent No.: US 11,755,350 B2
(45) Date of Patent: *Sep. 12, 2023

(54) CONTROLLER FOR A MEMORY COMPONENT (71) Applicant: Micron Technology, Inc., Boise, ID (US)

(72) Inventors: Antonino Mondello, Messina (IT); Alberto Troia, Munich (DE)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/745,546

(22) Filed: May 16, 2022

(65) Prior Publication Data
US 2022/0276885 A1 Sep. 1, 2022

Related U.S. Application Data (63) Continuation of application No. 16/624,948, filed as application No. PCT/IB2019/000478 on May 31, 2019, now Pat. No. 11,334,377.

(51) Int. Cl.
G06F 9/455 (2018.01)
G01R 31/3185 (2006.01)
G06F 9/32 (2018.01)
G06F 9/4401 (2018.01)
G06F 9/445 (2018.01)
(Continued)

(52) U.S. Cl.
CPC ..... *G06F 9/455* (2013.01); *G01R 31/318555* (2013.01); *G01R 31/318558* (2013.01); *G01R 31/318597* (2013.01); *G06F 9/328* (2013.01); *G06F 9/4401* (2013.01); *G06F 9/44521* (2013.01); *G06F 11/0736* (2013.01); *G06F 15/7807* (2013.01)

(58) Field of Classification Search
CPC ........ G06F 9/455; G06F 9/4401; G06F 9/328; G06F 9/44521; G06F 11/0736; G06F 15/7807; G01R 31/318558; G01R 31/318555; G01R 31/318597
See application file for complete search history.

(56) References Cited

U.S. PATENT DOCUMENTS 11,334,377 B2 * 5/2022 Mondello ...... G01R 31/318558
2014/0380294 A1 12/2014 Wu
(Continued)

OTHER PUBLICATIONS

International Search Report & Written Opinion from related International Application No. PCT/IB2019/000478, dated Mar. 6, 2020, 13 pages.

*Primary Examiner* — Cynthia Britt
(74) *Attorney, Agent, or Firm* — Brooks, Cameron & Huebsch, PLLC (57) ABSTRACT A controller for a memory component comprises a processing unit and at least one memory unit coupled to the processing unit, the memory unit comprising at least a first area for storing a user firmware and a second area for storing a controller firmware; the processing unit is configured to capture a memory address of a program instruction to be executed, compare the memory address with a reference value, and, based on that comparison, enable/restricting actions associated with the program instruction. A related memory component and related methods are also disclosed.

20 Claims, 9 Drawing Sheets

(51) Int. Cl.
*G06F 11/07* (2006.01)
*G06F 15/78* (2006.01)

(56) References Cited

U.S. PATENT DOCUMENTS

| | | |
|---|---|---|
| 2016/0028728 A1 | 1/2016 | Hampel et al. |
| 2016/0196170 A1 | 7/2016 | Stapleton |
| 2019/0042229 A1 | 2/2019 | Kotary et al. |

* cited by examiner

CONTROLLER FOR A MEMORY COMPONENT

PRIORITY INFORMATION

This application is a Continuation of U.S. application Ser. No. 16/624,948 filed on Dec. 20, 2019, which is a National Stage Application under 35 U.S.C. § 371 of International Application Number PCT/IB2019/000478, filed May 31, 2019, the contents of which are incorporated herein by reference.

TECHNICAL FIELD

The present disclosure relates to memory devices and more particularly to a controller for a memory component.

BACKGROUND

Non-volatile Flash memories are today one of the fundamental building blocks in modern electronic systems, particularly for Real Time Operating Systems (RTOS). Generally, the operation of the non-volatile Flash memories is managed by a controller including an embedded firmware, such controller performing the required write/read/erase operations.

The performances of Flash memories in terms of speed, consumption, alterability, nonvolatility and the increasing importance of system reconfigurability have pushed up to now for their integration in System-on-Chip (SoC) devices.

A SoC is a semiconductor integrated circuit that integrates all components of a computer or other electronic systems. These components typically include a central processing unit (CPU), SoC controllers, memory portions, input/output ports and secondary storage components, all on a single semiconductor substrate. A SoC may contain digital, analog, mixed-signal, and often radio frequency signal processing functions, depending on the application. As they are integrated on a single electronic substrate, a SoC device may consume much less power and take up much less area than multi-chip designs with equivalent functionality. SoC devices are nowadays very common in the mobile computing, in embedded systems and in the Internet of Things (IoT).

When a Flash memory is coupled to a SoC, the SoC controller communicates and interacts with the Flash controller, i.e. with the controller of the Flash memory.

Generally, in the known solutions, the interaction of an external controller, such as the SoC controller, with the Flash controller is limited only to standard customer commands and the access to the firmware embedded in the Flash controller shall not be permitted. The Flash controller firmware is therefore used only by the internal Flash controller and the user is not allowed to use it.

DETAILED DESCRIPTION

With reference to those drawings, systems and methods involving a controller for a memory component (in particular including a non-volatile memory) will be disclosed herein.

More particularly, as it will be described into details in the following, an example controller for a memory component comprises a processing unit and at least one memory unit coupled to the processing unit, the memory unit comprising at least a first area for storing a user firmware and a second area for storing a controller firmware, wherein the processing unit is configured to capture a memory address of a program instruction to be executed, the memory address being associated with the memory unit, compare the memory address with a reference value, and, based on that comparison, enable/disable (i.e. restrict) actions associated with the program instruction. In particular, the controller of the memory component is configured to store certain information that can be shared with an external controller (for example with a System-on-Chip controller), while other stored information remains secret and the user is not allowed to access thereto.

Moreover, an example method according to the present disclosure comprises the steps of storing a user firmware in a first area of a memory unit and storing a controller firmware in a second area of the memory unit, capturing a memory address of a program instruction to be executed, comparing the memory address with a reference value, and, based on that comparison, enabling/disabling (i.e. restricting) actions associated with the program instruction.

Non-volatile memories retain their contents when power is switched off, making them good choices for storing information that is to be retrieved after a system power-cycle. However, a non-volatile memory is typically slower than a volatile memory, and often it has more complex writing and erasing procedures.

A Flash memory is a type of non-volatile memory that retains stored data and is characterized by a very fast access time. Moreover, it can be erased in blocks instead of one byte at a time. Each erasable block of memory comprises a plurality of non-volatile memory cells arranged in a matrix of rows and columns. Each cell is coupled to an access line and/or a data line. The cells are programmed and erased by manipulating the voltages on the access and data lines.

Currently, the technology of the complex semiconductor structures known as System-on-Chips provides the integration of at least an embedded non-volatile memory up to 128 Mbit.

Figure 1:
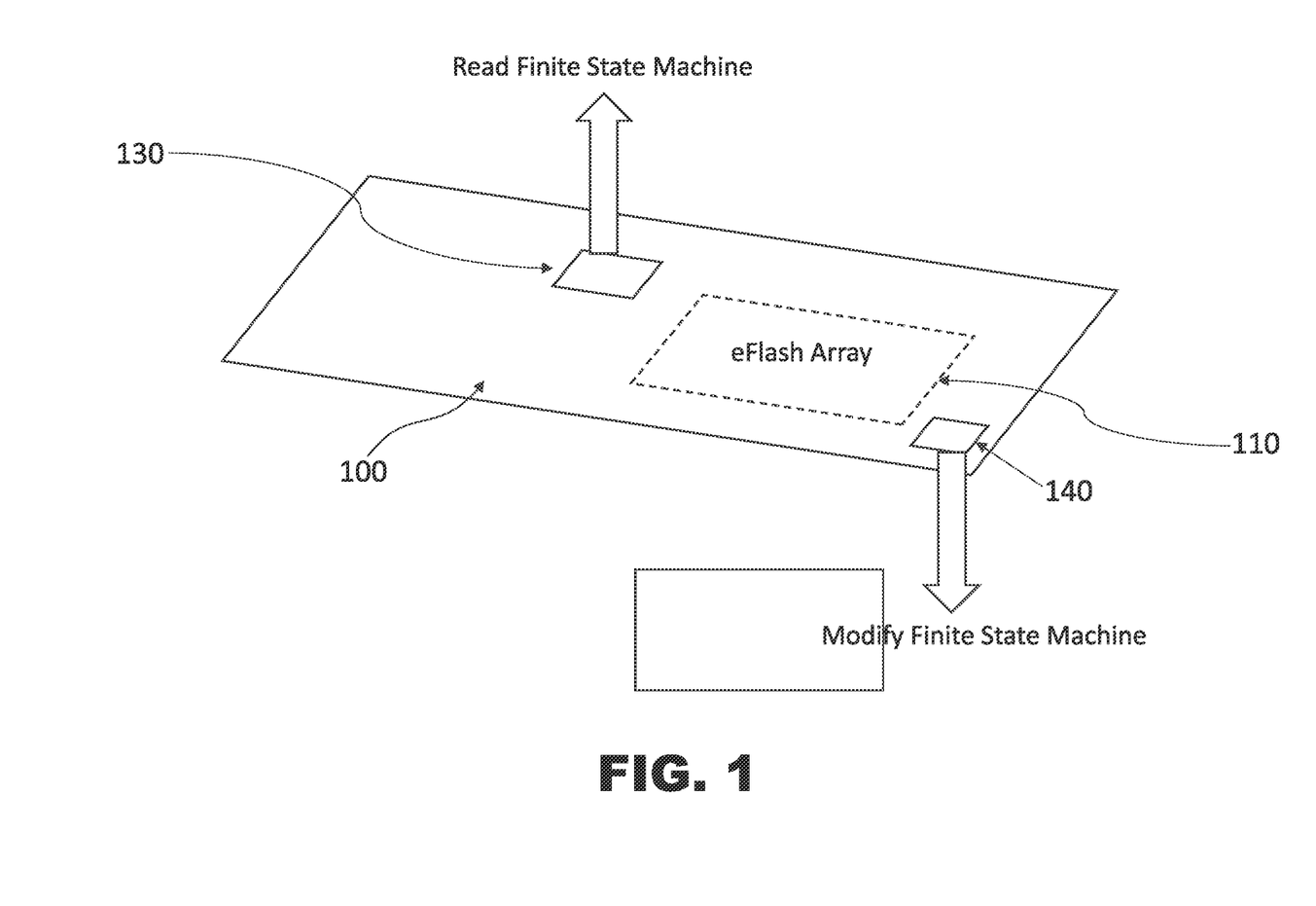
FIG. 1 is a schematic and perspective view of a System-on-Chip device according to the prior art and including an embedded memory portion.

FIG. 1 shows an example of a known solution of a complex System-on-Chip (SoC) structure 100 including a large circuit portion occupied by a conventional embedded non-volatile memory portion 110.

This embedded non-volatile memory portion 110 includes an array of Flash memory cells indicated in FIG. 1 as eFlash Array.

In order to read the memory cells of the Array, it is provided a dedicated circuit portion 130 including an optimized Read Finite State Machine that is used to ensure high read performance, such as branch prediction, fetch/prefetch, interrupt management, error correction and so on.

In order to write and erase the memory cells of the Array, it is provided a dedicated logic circuit portion 140 including a simplified Reduced Instruction Set Computer (RISC) controller or a Modify Finite State Machine which is the logic circuit for handling the programming and erasing algorithms.

Figure 2:
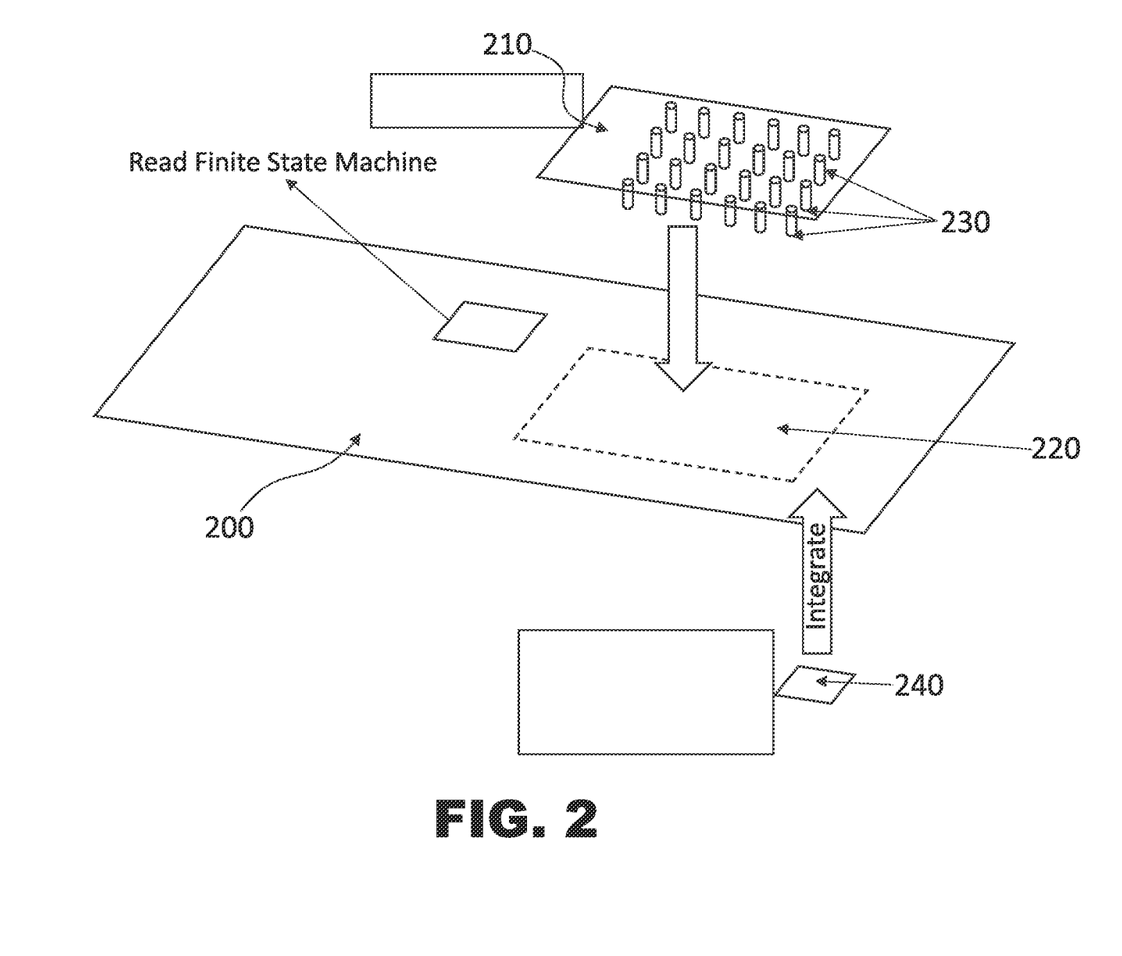
FIG. 2 is a schematic and perspective view of a System-on-Chip device according to the present disclosure and including a memory component replacing the embedded memory portion of the prior art devices.

As shown in FIG. 2, according to the present disclosure, the memory portion (i.e. the reference number 110 of FIG. 1) is removed from the SoC structure thus allowing to use the corresponding semiconductor area for other logic circuits and for providing support for a structurally independent memory component 210 partially overlapping a SoC structure 200. The size of this memory component 210 is enlarged up to more than 256 Mbit or even 512 Mbit. Generally, the memory component 210 has a variable size depending on the size of the memory array included therein, which is manufactured according to the user's needs in a range of values from 128 Mbit to 512 Mbit or more.

The removal of the embedded memory portion has further the great advantage to free space, thus obtaining a semiconductor area 220 of the SoC structure 200 allowing the integration of additional user's function and/or an overall SoC area reduction.

The result of this solution is the new SoC structure of FIG. 2, strictly associated with the new structurally independent memory component 210 that is coupled to the SoC structure 200, for instance through a plurality of coupling elements 230, such as pillars, as well as through silicon vias, ball-in-grid, flip-chip technology, wireless interconnection (coils) and the like. In one embodiment, the coupling elements are pillars, which are arranged in the semiconductor area 220 previously dedicated to the embedded memory portion 110 of FIG. 1.

In one embodiment of the present disclosure, the memory component 210 for the SoC structure 200 includes at least a memory portion and a logic circuit portion for interacting with the memory portion and with the SoC structure 200, wherein the memory component 210 is a structurally independent semiconductor device coupled to and partially overlapping the System-on-Chip structure 200. A logic circuit 240 is integrated in the SoC structure 200 to cooperate with the logic circuit portion of the memory component 210.

More generally, the memory component 210 has a minor size if compared with the larger size of the SoC structure 200, the term "partially overlapping" meaning that the memory component 210 covers only partially or not completely the area of the SoC structure 200.

The coupling between the SoC structure 200 and the memory component 210 is made by interconnecting a plurality of respective pads or pin terminals that are faced one toward the other in a circuit layout that keeps the alignment of the pads even if the size of the memory component 210 is modified.

In one embodiment of the present disclosure, the arrangement of the pads of the memory component 210 has been realized on a surface of the memory component 210. More specifically, the pads are arranged over the array so that, when the memory component 210 is reversed, its pads are faced to corresponding pads of the SoC structure 200. The semiconductor area 220 that in known System-on-Chip devices 100 was occupied by the embedded non-volatile memory portion is dedicated to the housing of the interconnecting pads corresponding to the pads of the memory component 210 and is used for other circuitry at the same time.

Even a memory component of a larger size may be supported and interconnected with the pads of the SoC structure 200, keeping the position and dislocation of its interconnecting pads.

In the contest of the present disclosure, the SoC structure 200 has its top side linked with the reversed side of the memory component 210, the pads of the SoC structure 200 being aligned with matching pads of the reversed memory component. As an alternative, the structurally independent memory component 210 may be coupled to the SoC structure 200 in a wireless manner. If a wireless coupling is adopted, a stack of memory components of the same size could be overlapped realizing a stack structure, wherein each independent component is addressed by the logic circuitry of the SoC structure 200 though a corresponding identification address.

The semiconductor area 220 previously occupied by the embedded memory portion 110 is now used to implement additional functionalities and to prepare the semiconductor device for a Logic Over Pads technology. The expression "Logic Over Pads" means providing logic circuitry overlapping some connection pads located internally to a first or base layer represented by a complete semiconductor product, i.e. the SoC structure 200.

The memory component 210 thus represents an upper layer coupled and interconnected to the base SoC structure 200. The memory component 210 partially overlaps the SoC structure surface covering at least the semiconductor area 220 previously occupied by the embedded memory portion 110. However, the memory component 210 has a greater capacity can cover a larger semiconductor area than the semiconductor area 220. In this respect, the size of the overlapping memory component 210 is larger than size of the overlapped semiconductor area 220 dedicated to the interconnections with such covering memory component 210. In other words, the area of the overlapping memory component 210 is larger than the semiconductor area 220 of the SoC structure 200 dedicated to the interconnecting pads for the memory component 210.

Moreover, for a better functioning of the SoC structure 200, even the logic circuit portion 140 of FIG. 1 (which in the SoC device 100 of FIG. 1 included the Modify Finite State Machine or RISC) can be removed and reorganized in association with the memory component 210. For supporting the write and erase phases performed on the larger memory component 210, a Modify Finite State Machine or RISC 240 has migrated into the memory component 210.

As previously indicated, the memory component 210 includes the logic circuit portion for interacting with the memory portion and with the SoC structure 200.

The separation and optimization of the logic circuit portion further allows to enhance the functionality of the whole SoC structure 200, thus obtaining an independent semiconductor memory component 210 coupled to the SoC structure 200.

This independent semiconductor memory component 210 therefore includes at least the memory portion (for example, a non-volatile memory portion) and the associated modify finite state machine 240, both incorporated into a semiconductor product that is coupled to the SoC structure 200. In this case, the memory logic in the SoC structure 200 is the one handling the memory interface communication.

In other words, both the non-volatile memory portion and the associated logic circuit portion are integrated in the independent semiconductor memory component 210 that is coupled and connected to the SoC structure 200.

Figure 3:
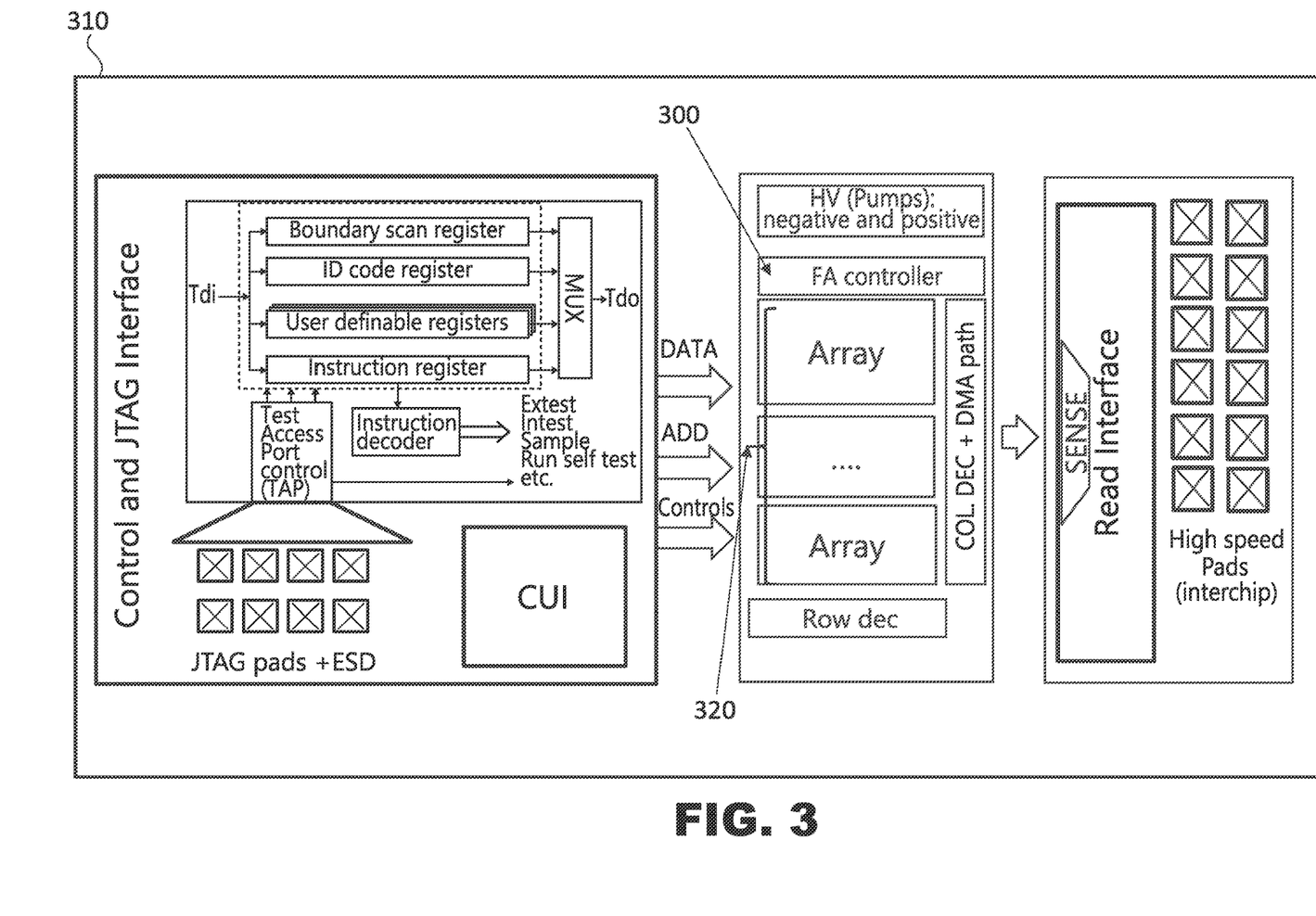
FIG. 3 is a schematic view of the memory component according to the present disclosure.

Now, with more specific reference to the example of FIG. 3, the main structure of the memory component 310 according to an embodiment of the present disclosure will be disclosed, wherein the reference 310 of FIG. 3 corresponds to the reference 210 of FIG. 2.

The memory component 310 includes at least: an IO circuit, a micro-sequencer, an array of memory cells 320, an array peripheral, a charge pump architecture (including positive and negative pumps), address decoders, sense amplifiers and corresponding latches, a service logic to connect all the parts of the memory, and a command user interface, for instance a CUI block. The memory component communicates through a plurality of High Speed Pads and a plurality of high/low speed JTAG Pads that may be protected against Electrostatic Discharge (ESD).

The array of memory cells 320 includes non-volatile Flash memory cells in one example.

In one embodiment of the present disclosure, the memory component 310 implements a Direct Memory Access type of memory to replace the embedded memory array of known SoC devices.

Moreover, the proposed idea provides for the implementation of the memory component 310 in a "Known Good Die" (KGD) form factor or bare die, that allows connecting the sense amplifier outputs, except for a latch structure in the middle, directly with a controller of the SoC structure.

Strategies for obtaining the KGD form factor have been based on taking advantage of the existing infrastructure for test and burn-in of traditionally packaged components. This minimizes the amount of hardware, tooling, or insertions that add cost to the bare die products.

Moreover, a JTAG interface is adopted for the test of the memory component 310, allowing the re-use of the testing tooling. Therefore, the memory component 310 also comprises a JTAG logic.

The memory component 310 uses the interconnection pads and the logic circuit portion to allow the interconnection with the SoC structure.

The final configuration will be a face-to-face interconnection SoC/Flash Array, wherein the sense amplifiers of the memory component 310 will be connected to the SoC in a Direct Memory Access configuration. The interconnections also include the JTAG interface and control pins for testing and other purposes.

In this manner it is possible to keep relatively low the number of required interconnections, for example within the range of 600 to 650 pads.

The memory array 320 of the memory component 310 is built as a collection of subarrays. The scan chains can be connected to form a unique shift register to proper test the interconnections.

The advantage of this architecture is that it is very scalable, wherein expanding and/or reducing the density of the final device translates only in mirroring a sub-array and generating the connection.

The Direct Memory Access allows to reduce the final latency that the SoC can experience when reading the data.

According to the present disclosure, the memory component 310 is equipped with a controller 300 of the flash array 320 (hereinafter referred to as Flash array controller), said flash array controller 300 having an architecture that allows sharing some flash array resources with the SoC controller without compromising the secrecy of certain information stored therein (for example, algorithms, flash array voltages, currents, and more in general process information) and guarantees eventual customer return management.

Figure 4:
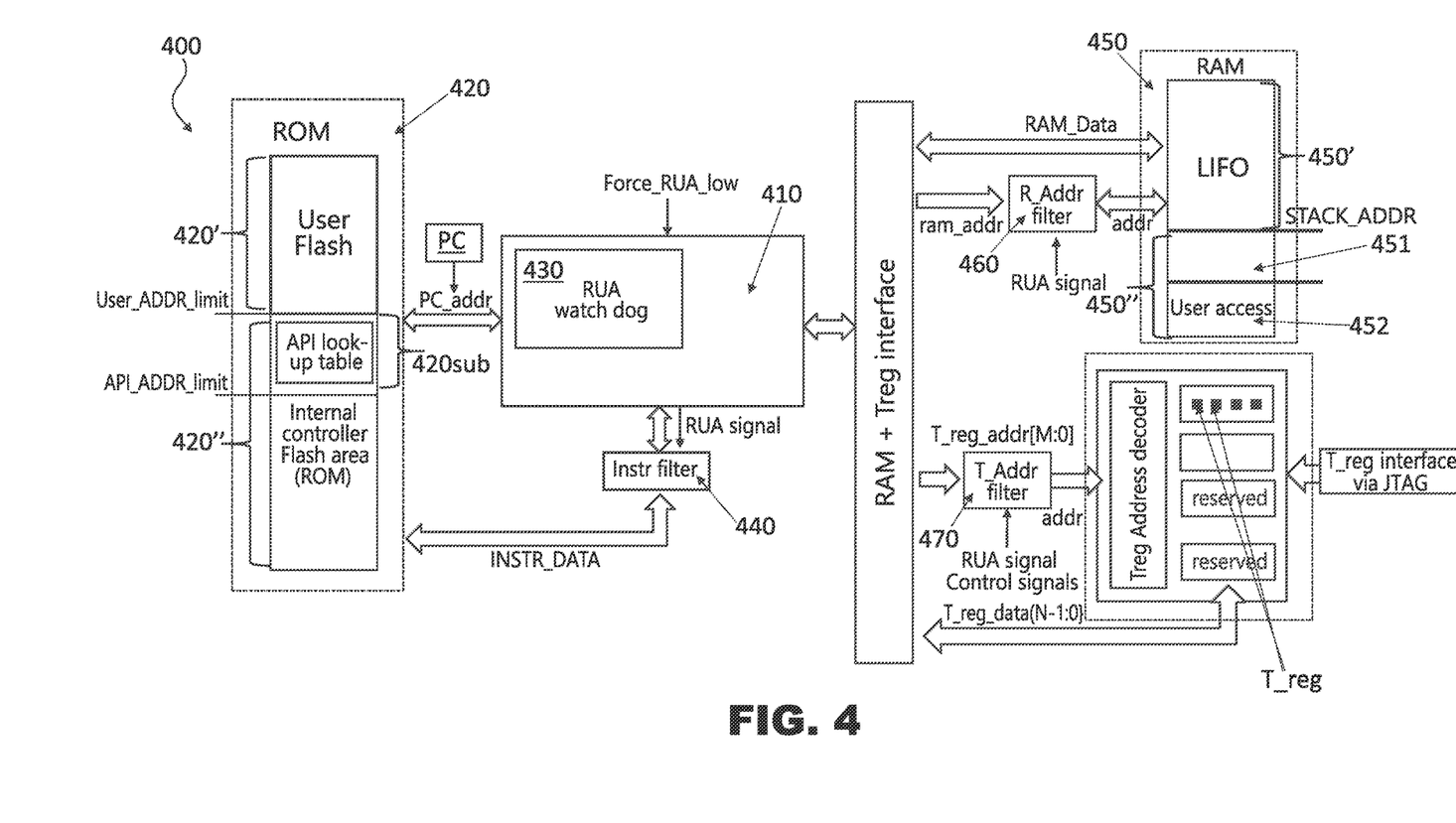
FIG. 4 schematically shows an architecture of a controller of the memory component according to the present disclosure.

FIG. 4 is a schematic view of the architecture of a controller 400 according to the present disclosure, where the controller 400 corresponds to the controller 300 of FIG. 3.

The controller 400 comprises a processing unit 410 and a memory unit 420 operatively connected with the processing unit 410.

According to an embodiment of the present disclosure, as shown in FIG. 4, the memory unit 420 is a Read Only Memory (ROM) in the form of a dedicated Flash array that is partially addressable (readable/writable) from outside the Flash array controller 400, i.e. from the SoC controller, as it will be described into details in the following.

More in particular, the ROM comprises at least two different flash blocks logically mapped as a continuous address space. In other words, the ROM is divided into a first area 420' and into a second area 420" mapped as a continuous address space, which are physically separated and can be erased independently.

As shown in FIG. 4, the processing unit 410 includes a control portion 430 (which is also referred to as ROM User Area—RUA—watch dog) configured to allow a selective and guided access of the user to the areas of the ROM, as it will be described in the following.

According to an embodiment of the present disclosure, the user can write and store his own firmware in the first area 420' of the ROM. Therefore, the first area 420' comprises the user firmware and can be accessed by an external controller, for example by the controller of the SoC.

On the other hand, the second area 420" is configured to store the flash array controller firmware (i.e. the internal controller firmware managing the operation of the system and written by the manufacturer) and cannot be directly accessed by the user. The second area 420" can thus be written only by the manufacturer and the user cannot directly access to it and cannot directly use and change the firmware embedded therein.

Due to the above separation of the first and second area, the ROM of the controller 400 of the present disclosure is thus partially addressable (readable/writable) by the SoC controller.

In order to correctly identify which instruction of the user firmware should be retrieved for execution, the controller 400 includes a register that identifies which firmware instruction to retrieve and execute next, such a register being commonly referred to as a program counter (PC).

The control portion 430 of the processing unit 410 is connected to the program counter PC via an address bus so that it can capture the value of the program counter PC and read the memory address of the instruction to be executed, such address being herein referred to as PC_addr.

The processing unit 410, in particular the control portion 430, is then configured to compare the memory address received from the program counter PC with a reference value (or threshold address, hereinafter indicated as User_ADDR_limit) that has been previously stored in the processing unit 410. The reference value User_ADDR_limit can be set by the manufacturer according to the needs and/or circumstances.

According to an embodiment of the present disclosure, the reference value User_ADDR_limit is a ROM memory address delimiting the first area 420' from the second area 420'. Preferably, the reference value User_ADDR_limit belongs to the first area 420' of the ROM and is the memory address at the separation between said first area 420' and the second area 420" of the ROM.

In particular, if the memory address PC_addr received from the program counter PC belongs to the first area 420' of the memory unit 420 (i.e. it is associated with the first area 420'), the processing unit 410, in particular the control portion 430, generates a corresponding output signal adapted to disable actions associated with the instruction of the user firmware to be executed and corresponding to the memory address PC_addr, thus applying a restriction to said instruction of the user firmware.

In this way, the controller 400 is able to recognize that the instruction to execute is not an instruction of the controller firmware written by the manufacturer, but an instruction of the user firmware having a lower (or in general different) priority level and therefore having some restrictions, so that part of the manufacturer code in the second area 420", as well as other regions, cannot be directly accessed by the external user.

More in particular, the generated output signal is adapted to trigger dedicated filtering blocks of the controller 400, said filtering blocks being configured to act on the instructions of the user firmware (e.g. on the destination addresses of such instructions) for preventing the execution of some actions associated with said instructions, in this way applying the above-indicated restrictions to the instructions of the user firmware.

The above-mentioned output signal of the processing unit 410 is hereinafter also indicated as RUA signal.

More specifically, in one embodiment of the present disclosure, the RUA signal is generated by a state machine in the processing unit 410, such signal assuming different values based on the above comparison of the memory address PC_addr with the reference value User_ADDR_limit. For example, the RUA signal can be high (e.g. equal to 1) when the memory address PC_addr associated with the user instruction is an address of the first area 420' of the ROM, and can be low (i.e. equal to 0) when the memory address PC_addr is an address of second first area 420" of the ROM.

In an embodiment of the present disclosure, the processing unit 410, in particular its control portion 430, is configured to generate and assert the RUA signal when the value of the program counter PC is lower than or equal to the reference value User_ADDR_limit, i.e. when the program counter PC is inner the ROM area shared with the external controller (namely, inner the first area 420' of the ROM). The control portion 430 of the processing unit 410 is thus configured to verify whether PC_addr≤User_ADDR_limit.

Therefore, based on the above comparison between the captured memory address PC_addr of the program instruction and the reference value User_ADDR_limit, it is possible to enable/disable actions associated with the program instructions of the user firmware, in particular thanks to the RUA signal generated by the processing unit 410.

As it will be disclosed in the followings in grater detail, the actions associated with the program instructions of the user firmware may be for example the access to specific portions of the ROM, as well as the selection of particular addresses of a RAM, or also the selection of particular test registers implemented in the memory component associated with the controller 400. The above-mentioned filter blocks activated by the RUA signal (i.e. activated when PC_addr≤User_ADDR_limit) are therefore able to recognize and to act on the particular destination address of said instructions in order to prevent said actions.

According to one embodiment of the present disclosure, the user firmware is able to use some subroutines of the controller firmware without having a directly access and knowledge of the details of such subroutines.

In particular, in order to interface the user firmware of the first area 420' with the controller firmware of the second area 420", the second area 420" of the memory unit 420 comprises a plurality of Application Programming Interfaces (APIs). According to an embodiment of the present disclosure, it is not possible to directly call an API of the second area 420" by the user firmware, i.e. directly from the first area 420', so that some reserved information is not shared with the user. The API are called as described in the following.

More in particular, the second area 420" of the ROM is further configured to store a plurality of Call instructions that can be called by the user firmware, each of these Call instructions being associated with a specific address of said second area 420". The Call instructions interrupt the flow of the program by passing control to a subroutine of the controller firmware. In this way, the plurality of Call instructions defines a sub-area 420sub within the second area 420" of the memory unit 420, this sub-area 420sub storing all the needed Call instructions. The Call instructions of this sub-area 420sub are adapted to call all the API contained in the second area 420" of the ROM and therefore are adapted to interface the user firmware of the first area 420' with subroutines of the controller firmware of the second area 420".

The API in the second area 420" are written by the manufacturer and the user cannot directly access it and cannot change it. In this way, through the Call instructions of the sub-area 420sub, the user program in the first area 420' can interact with the controller program in the second area 420" without a direct access to the latter.

The plurality of Call instructions in the sub-area 420sub of the second area 420" defines an API look up table in said second area 420" of the memory unit 420, this API lookup table being a collection of Call instructions adapted to implement an interface for the external user.

The addresses of the Call instructions stored in the sub-area 420sub of the ROM second area 420" are comprised between the memory addresses of the first area 420' and the remaining addresses of the second area 420', the sub-area being directly accessible by instructions of the user firmware.

More particularly, according to one embodiment of the present disclosure, the sub-area 420sub containing the Call instructions is allocated on the top of the second area 420", and the reference value User_ADDR_limit is the lowest address of the first area 420'. In other words, the sub-area 420sub is the portion of the second area 420" characterized by higher addresses, even if other configurations are not excluded.

According to an embodiment of the present disclosure, the RUA signal generated by the processing unit 410 prevents a direct call of an API instruction in the second area 420" by the user firmware from the first area 420'. More specifically, if an API is directly called by a user firmware instruction, the control portion 430 of the processing unit 410 captures the corresponding address PC_addr of the program counter PC and establishes that it belongs to the first area 420': as a consequence, the RUA signal is generated (e.g. the RUA signal is equal to 1), and the user is not allowed to directly call an API located in the second area 420".

Figure 5:
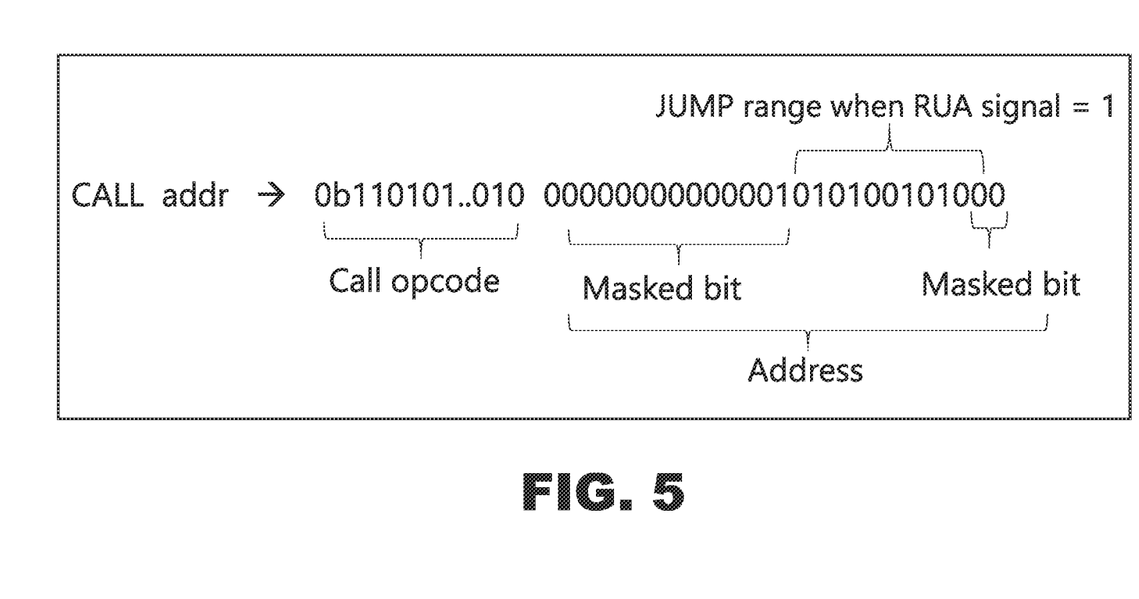
FIG. 5 is an example of an instruction filtered by the controller according to the present disclosure.

More in particular, according to an embodiment of the present disclosure, the processing unit 410 is configured to implement a first filtering block 440 which, based on the RUA signal, acts on the user program instruction. When the RUA signal is generated (e.g. the RUA signal is equal to 1), the first filtering block 440 is configured to mask parameters of the program instruction of the user firmware to prevent the direct call to the second area of the memory unit, as shown in FIG. 5, where some bits are forced to 0 (e.g., those bits identified as "Masked bit" in FIG. 5). For example, when the RUA signal is equal to 1, the instruction is filtered so that the destination addresses of JMPs and Calls instructions are masked to prevent a direct jump into the internal controller FLASH area and the significant digits are set to 0. The farther jump/call permitted by the controller architecture is therefore into the API look table area, i.e. into the sub-area 420sub.

Figure 6A:
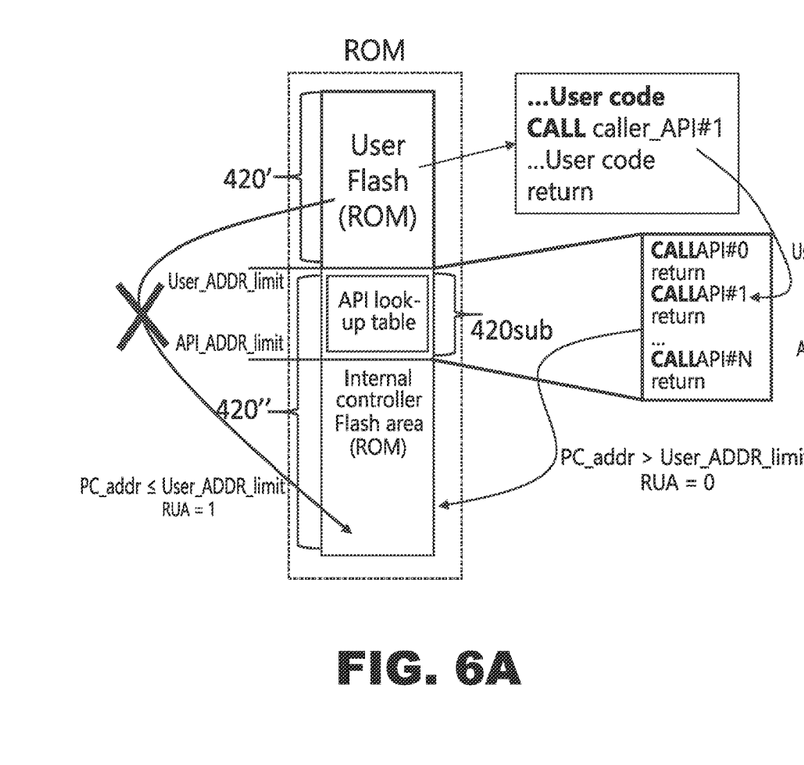
FIGS. 6A and 6B schematically show an access operation to areas of a ROM of the controller of the present disclosure.
Figure 6B:
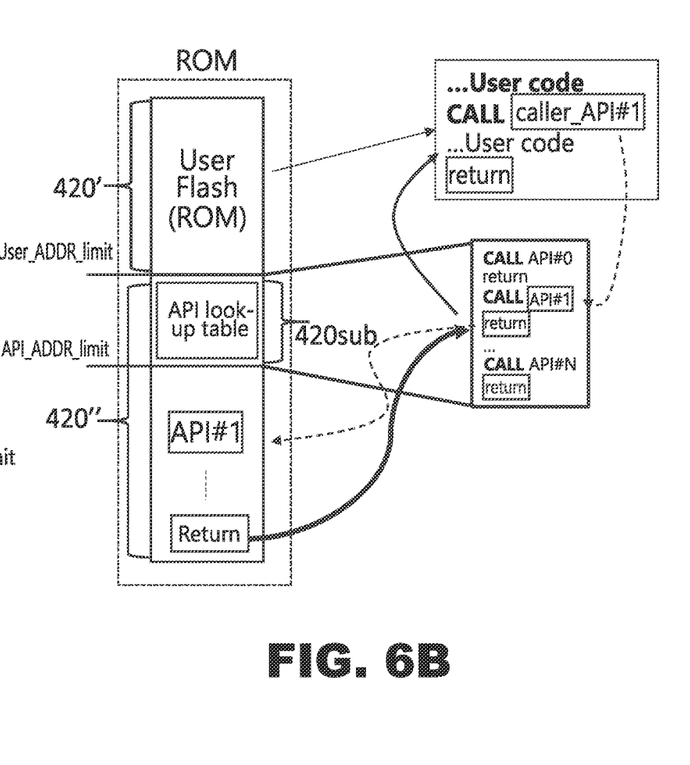

On the other hand, if the user program instruction calls a Call instruction of the API look up table in the sub-area 420sub, the control portion 430 detects that PC_addr>User_ADDR_limit and no control output signal is generated (i.e. the RUA signal is equal to 0), since the memory address is in this case an address associated with a Call instruction in the sub-area 420sub, which is a permitted area; in this way, the Call instruction called by the user firmware is able to call an API of the second area 420", which is thus executed without any restriction because it is called by an instruction in the sub-area 420sub, as shown in FIGS. 6A and 6B. FIG. 6A illustrates this general principle and FIG. 6B illustrates an example case where the first API of the plurality of APIs is called by the corresponding caller in the sub-area 420sub. When a subroutine is called by a Caller corresponding to a RUA signal equal to 0, all the actions are therefore allowed. The call (and the corresponding return) is therefore a two-step process and no direct Call is allowed.

In this way, the user can invoke the desired API of the second area 420" by means of the Call instructions in the sub-area 420sub and the associated actions can be executed.

Summing up, an API can be called by an instruction stored in the sub-area 420sub, i.e. inner the internal controller Flash Rom area, having memory addresses between the reference value User_Addr_limit and a further limit value in the second area 420", herein referred to as API_ADDR_limit. Such call instruction is first called by an instruction of the user firmware, i.e. inner the user Flash Rom area. This has the advantage that the user can write his own firmware in the first area and can interact with the controller internal firmware in the second area, while maintaining the secrecy of certain information, providing a very versatile and reliable controller.

Referring again to FIG. 4, according to an embodiment of the present disclosure, the controller 400 further comprises a Random-Access Memory (RAM) 450 comprising a first RAM area 450', which is directly accessible by the user firmware (and therefore directly accessible by an external controller such as the SoC controller), and a second RAM area 450" having different addresses. The first area 450' of the RAM is the stack pointer where data are organized in a LIFO configuration, allowing the execution of PUSH-POP instructions as known in the art. Accordingly, the user is always allowed to access to this area without any restriction.

The separation RAM address between the first RAM area 450' and the second RAM area 450" is hereinafter referred to as STACK_ADDR.

The second area 450" of the RAM comprises a first portion 451 that can never be accessed by the user (only the manufacturer can access to that first portion 451) and a second portion 452 that can be accessed by the user under specific circumstances.

In particular, when the processing unit 410 generates the output signal (i.e. when the RUA signal is equal to 1), a dedicated second filtering block 460 (hereinafter referred to as R_Addr_filter) prevents the selection of all the addresses of the second area 450" of the RAM, and also the second portion 451 of this area is not addressable. In this case, the user can have control only of the first area 450', i.e. the stack pointer area, by PUSH/POP instructions.

In other words, if the program instruction of the user firmware is associated with a memory address belonging to the first area 420' of the ROM, the processing unit 410 recognizes that such instruction has not the required privileges to access to the portion 452 of the RAM, so that the second filtering block 460, which receives at is input the address (indicated as ram_addr) of the portion of the RAM that the user wants to access, masks the relevant parameters of the instruction so that such portion is not addressable.

However, if the output signal is not generated (namely when the RUA signal is equal to 0), i.e. when an API of the second area 420" is called by the proper Call instruction in the sub-area 420sub (which is in turn called by the user program instruction in the first area 420'), all the restrictions are removed for that specific instruction and the user can have access to the second area 450" of the RAM, in particular to the second portion 452 of said second area of the RAM. In other words, when the RAM is addressed by an API called by its proper Caller, the constraints on the RAM address are removed.

Furthermore, according to an embodiment of the present disclosure, the controller comprises an interface with a plurality of test registers (simply indicated as T_reg), each register being associated with a specific address (indicated as T_reg_addr), for testing the functionality of the memory component to which the controller 400 is associated, or generally for interfacing the memory component with a testing machine and/or an external controller.

The test mode architecture of the memory component is therefore based on these registers, which, under certain circumstances, can be written/read by the SoC controller via JTAG interface, by the test machine via JTAG interface, and by the flash array controller 400 via internal buses.

The test registers T_reg contain the instructions (e.g. parameters such as currents/voltages) for the test of the memory component.

In particular, test registers are organized in several banks each containing N registers (N=8, 16, etc.) and being associated with a specific address (hereinafter referred to as TL_addr). Each bank is also apt to drive one or more macro function (Analog or Digital). For example, Bank 0 is devoted to Positive Read Charge Pump and each bit of the bank corresponds to a specific function (e.g. bit 0=PUMP enable, bit 5:1=clock frequency, bit 7:6=drive capability (Max current)), while Bank 12 is dedicated to Sense Amplifier.

The test of the memory component is therefore managed by a protocol based on a JTAG interface using the instructions of the test registers T_reg. As previously observed, the test can be controlled by the SoC controller or by an external test machine. In any case, both the approaches are based on a Built-In Self-Test (BIST) executed by the internal flash array controller 400 of the present disclosure. This approach also maintains secret the internal algorithm with sensitive technological parameters (such as timing voltages and the like).

In order to allow the use of some test registers and to disable the access to other reserved test registers, according to an advantageous embodiment of the present disclosure, the controller 400 comprises a third filtering block 470 (indicated also as T_Addr filter).

In fact, not all the test registers T_reg can be accessed by the external user, and the third filtering block 470 is configured to disable the access to some test registers T_reg based on the RUA signal generated by the processing unit 410. In this embodiment, the third filtering block 470 is configured in such a way that, when the RUA signal is generated by the processing unit 410, some reserved registers are not addressable by masking the specific address of such register, and the output of such third filtering block 470 yields only the first allowed register T_reg.

The test registers T_reg that are not addressable are written by the controller 400 in a configuration register.

As seen before, once the address captured from the program counter PC is inner the second area 420" of the ROM (i.e. when PC_addr>User_ADDR_limit) the RUA signal is equal to 0 and all the restrictions are removed. In other words, when a test register T_reg is accessed by an API called by a proper caller in the sub-area 420sub, such register is not forbidden and can be used by the external user (however, it cannot be used directly by the user firmware). In this way, the user can access to some register without the possibility of directly writing/erasing such registers, i.e. he has an indirect access to the registers.

In one embodiment, some registers T_reg can never be accessed by the user firmware and can be accessed only by the manufacturer, which has the required privileges to execute a specific test-mode requiring the user of such forbidden register.

According to an embodiment of the present disclosure, the processing unit 410 is also configured to receive at an input thereof a further signal that forces the control portion 430 to not generate a RUA signal (i.e. it sets RUA=0 by default). For example, this further signal, herein indicated as Force_RUA_low, is the output of one of the plurality of test registers T_reg, preferably a register that cannot be accessed by the external user (i.e. a register that can be accessed only with a high privilege test-mode, which can be performed for example only by the manufacturer). In this case, all constraints are removed.

Figure 7:
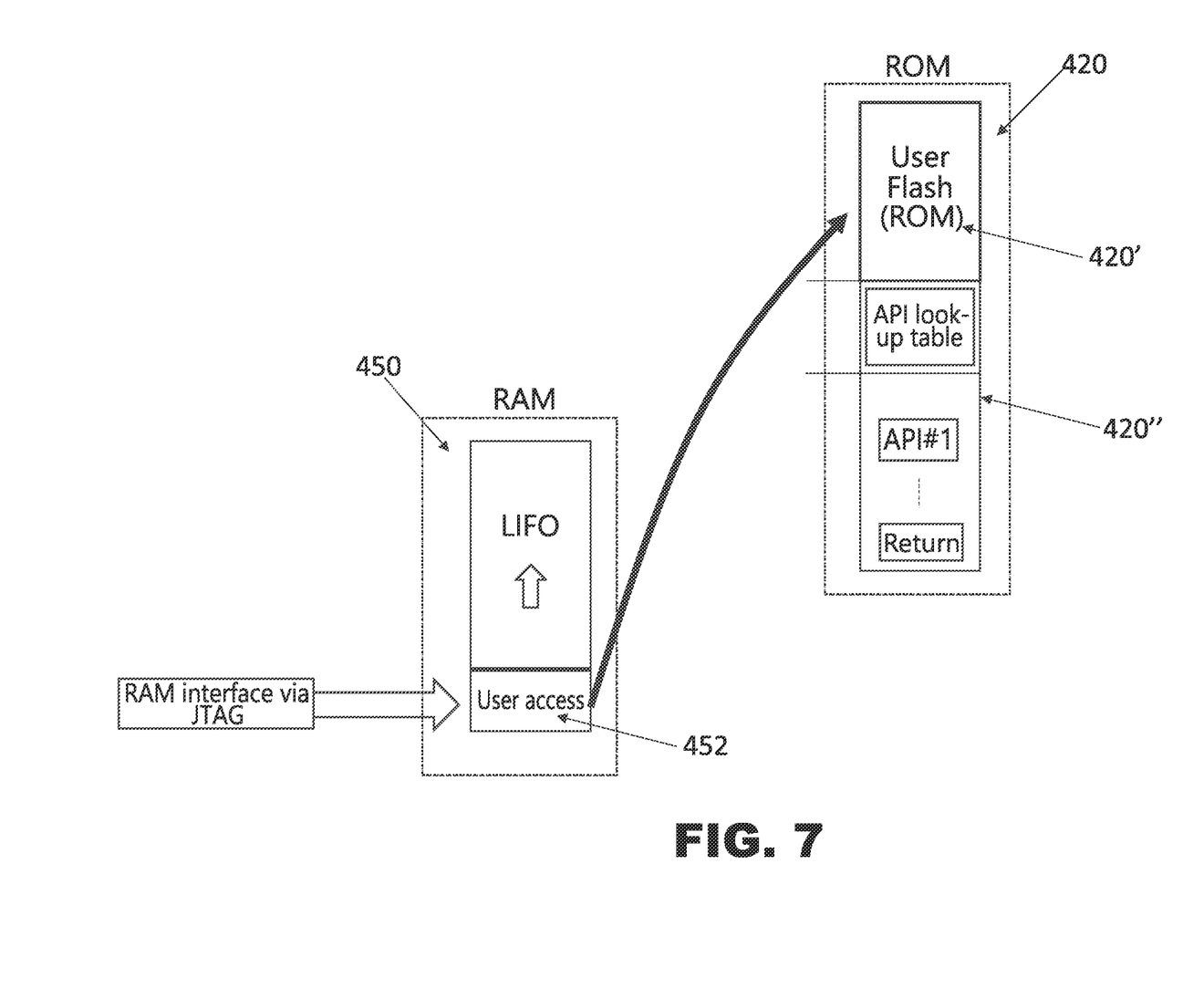
FIG. 7 schematically shows an initialization of a user area of the ROM of the controller of the present disclosure.
Figure 8:
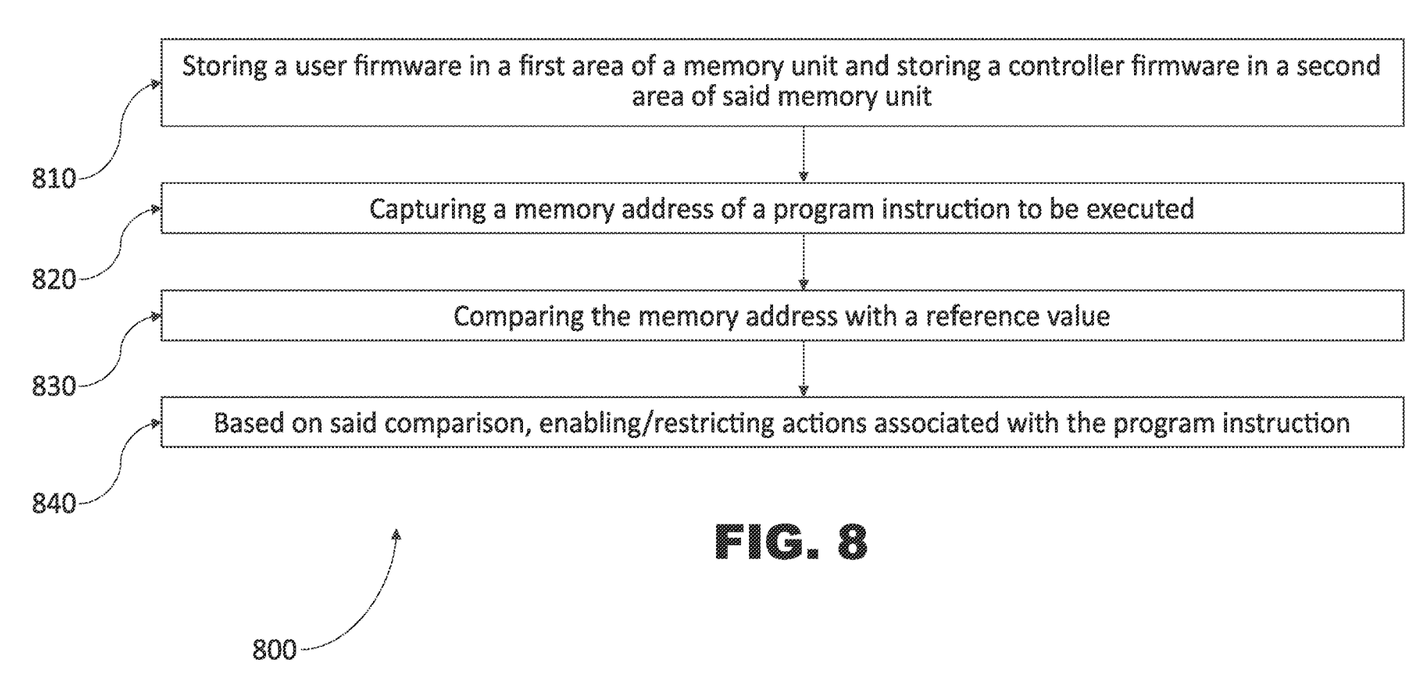
FIG. 8 shows a flow diagram of a method according to the present disclosure.

FIG. 8 shows a flow diagram of a method 800 according to the present disclosure. The method may be used to operate a memory component, for example memory component 210 or 310 described with reference to FIGS. 2 to 7 above.

Method 800 comprises, at step 810, storing a user firmware in a first area of a memory unit and storing a controller firmware in a second area of said memory unit. For example, the user firmware may be freely stored in the first area of the memory unit, while the controller firmware may be stored in the second area of the memory unit that is not accessible to the user, as described above.

Method 800 comprises, at step 820, capturing a memory address of a program instruction to be executed. The memory address may be captured by processing unit 410 as described with reference to FIG. 4, for example.

Method 800 comprises, at step 830, comparing the memory address with a reference value.

Method 800 also comprises, at step 840, based on said comparison, enabling/restricting actions associated with the program instruction. As described above with reference to FIGS. 2-7, the controller may carry out the comparison and apply any enabling or restricting action to the memory area.

Method 800 may further comprise the steps of generating an output signal when the captured memory address of the program instruction is an address of the first area of the memory unit, said output signal restricting the actions associated with the instruction of the user firmware; of triggering, via the output signal, filtering blocks acting on the instruction of the user firmware for preventing the actions associated with said instruction.

Method 800 may comprise the steps of storing a plurality of Application Programming Interfaces (API) in the second area of the memory unit, and storing a plurality of Call instructions in the second area of the memory unit, each of said Call instructions being associated with a specific address of said second area defining a sub-area therein, and calling, via the Call instructions, a respective API of the second area and to interface the user firmware with the controller firmware; and, optionally of masking parameters of the user program instruction for preventing said user program instruction of the first area from directly calling an API stored in said second area.

Method 800 may further comprise the steps of preventing the selection of specific addresses of the second RAM area; of preventing the selection of specific test registers, said test registers being adapted to interface the memory component with a testing machine and/or external controller; and/or of recognizing different users having different privileges and applying different constraints to the actions associated with the program instruction according to said privileges.

The steps of method 800 do not need to be executed in the order reported in FIG. 8 and additional steps (not reported) may be executed.

Figure 9:
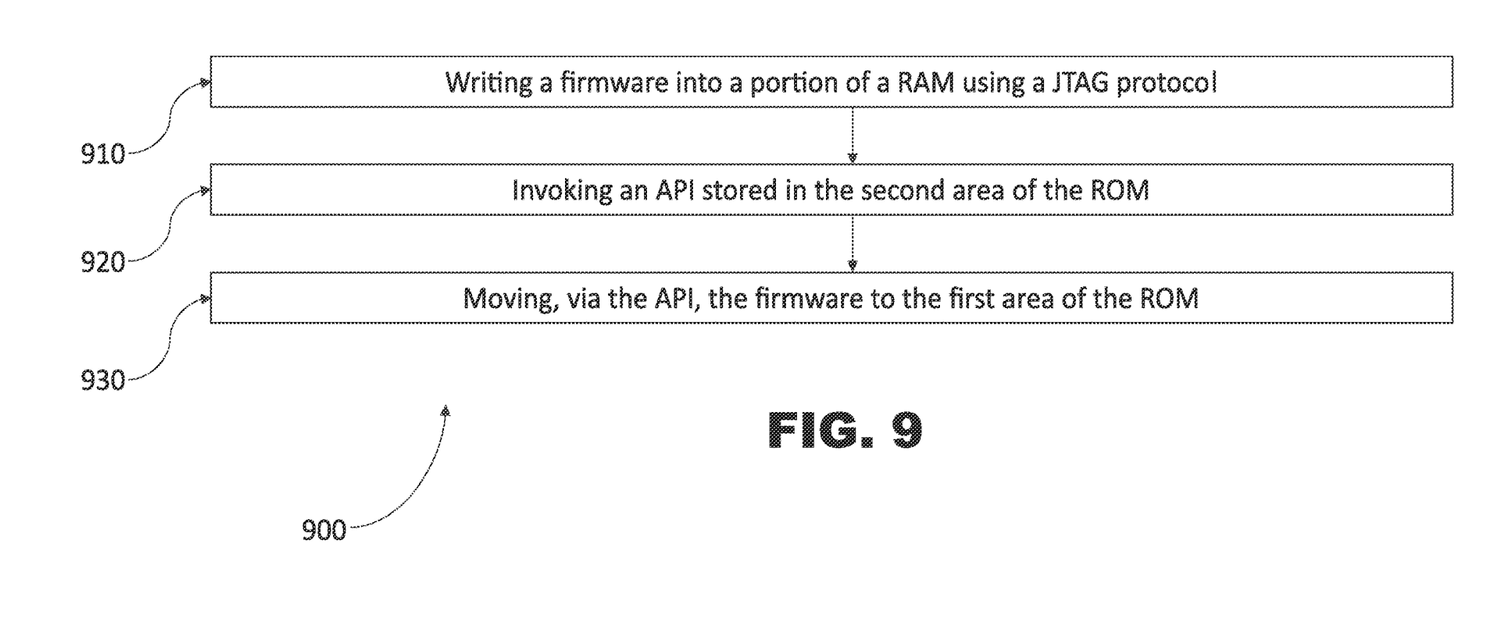
FIG. 9 shows a flow diagram of another method according to the present disclosure.

Finally, referring to FIG. 9, according to an embodiment of the present disclosure, the external controller (e.g. the controller of the SoC) is not able to direct programming the first area 420' of the ROM. The controller can then be programmed by the user through a method 900 comprising: writing a firmware into a portion of the RAM using the JTAG protocol (step 910), in particular into the second portion 452 of the second RAM area 450", as shown in FIG. 7. The method then comprises invoking an API stored in the second area 420" of the ROM (step 920), said API being specifically devoted to the user programming phase, and then moving, via this API, the firmware to the first area 420' of the ROM (step 930), where it is stored. The API devoted to User flash update then erases and programs the firmware into the flash block. The operation is possible because the two FLASHs have "well region" separated.

In conclusion, according to the present disclosure, the disclosed controller enables the user to write his own firmware in the dedicated ROM area and shares some information to perform specific operations, while secret information remains secret, since they are executed in an indirect way by means of the API lookup table and some areas of the controller can never be accessed. More in particular, thanks to the RUA signal generated by the processing unit, it is possible to implement an "Instruction Filter" configured to filter some instructions of the user program in order to avoid CALLs/JUMPs outside the permitted area. During the code execution from the user FLASH Rom area (i.e. when RUA=1) some constraints are therefore applied to code regions reachable, RAM address addressable, and T_REG and then textmodes usable. Therefore, even if the user is allowed to use some resources of the controller, it cannot directly access/write to forbidden areas of this controller.

This modified architecture ensures a great versatility of the controller of the present disclosure and permits the user to use some functionalities without directly accessing to forbidden areas.

Moreover, the filters can be configured such that different restrictions for different users having different access privileges can be applied (for example different RAM area, different constraint on T_reg and different API available). In particular, the filters of the controller can receive additional inputs accounting for the particular test-mode to be performed, each test-mode being associated to a particular user having a specific privilege, allowing the controller to apply different restrictions for different users, as above indicated. It is thus possible to perform different test-modes with different privileges, and according to such privileges, the access to some areas of the controller is forbidden.

In other words, the filtering blocks can be configured differently based on the different users, which can be recognized by the controller during authentication, such controller thus configurating the filters accordingly.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A controller for a memory component, comprising:
a processing unit; and
a memory unit coupled to the processing unit, the memory unit comprising a first area configured to store a user firmware and a second area configured to store a controller firmware;
wherein:
the processing unit is configured to:
compare a memory address of a program instruction to be executed with a reference value; and
determine actions associated with the program instruction based on the comparison; and
the memory component is coupled to a System-on-Chip (SoC) structure.

2. The controller according to claim 1, wherein the reference value is a memory address of the memory unit delimiting the first area from the second area, and wherein the processing unit is configured to generate an output signal when the received memory address of the instruction is an address of the first area of the memory unit, the output signal being adapted to restrict the actions associated with the instruction of the user firmware.

3. The controller according to claim 2, wherein the output signal of the processing unit is adapted to trigger filtering blocks, the filtering blocks being configured to act on the instructions of the user firmware for preventing the actions associated with the instructions.

4. The controller according to claim 1, wherein the memory unit is a Read Only Memory (ROM) physically separated into the first area and the second area, the first area and the second area being mapped as a continuous address space.

5. The controller according to claim 1, wherein the first area and the second area are mapped as a continuous address space.

6. The controller according to claim 5 wherein the second area is further configured to store a plurality of Call instructions, each of the Call instructions being associated with a specific memory address of the second area defining a sub-area therein, and wherein each of the Call instructions are adapted to call a respective API of the second area, interfacing the user firmware of the first area with the controller firmware of the second area.

7. The controller according to claim 6, wherein the addresses of the Call instructions stored in the sub-area of the second area are comprised between the addresses of the first area and the remaining addresses of the second area.

8. The controller according to claim 5, comprising a first filtering block configured to mask parameters of the program instruction for preventing the program instruction in the first area from directly calling an API of the plurality of APIs stored in the second area.

9. The controller according to claim 1, further comprising a Random Access Memory (RAM) comprising a first RAM area directly accessible by the user firmware, and a second RAM area having different RAM addresses from the first RAM area.

10. The controller according to claim 9, comprising a second filtering block configured to prevent the selection of specific address of the second RAM area based on the control signal of the processing unit.

11. A memory component, comprising:
an array of memory cells;
a controller coupled to the array and comprising:
a processing unit; and
a memory unit coupled to the processing unit, the memory unit is a Read Only Memory (ROM) comprising a first area to store a user firmware and a second area to store a controller firmware, the first area and the second area being mapped as a continuous address space;
wherein:
the processing unit is configured to:
compare a memory address of a program instruction to be executed with a reference value; and make a determination regarding actions associated with the program instruction based on the comparison.

12. The controller according to claim 11, further comprising an interface with a plurality of test registers adapted to interface the memory component with a testing machine and/or external controller, each of the test registers being associated with a specific address.

13. The controller according to claim 12, further comprising a third filtering block configured to disable the access to specific test registers.

14. The controller according to claim 11, wherein the processing unit is configured to read the memory address of the program instruction to be executed from a program counter.

15. The controller according to claim 11, wherein the processing unit is configured to receive a signal that forces the processing unit to remove all the constraints to the program instruction.

16. The controller according to claim 11, wherein the second area of the memory unit is configured to store a plurality of Application Programming Interfaces (API).

17. A method, comprising:
   storing a user firmware in a first area of a memory unit and storing a controller firmware in a second area of the memory unit, the first area and the second area being mapped as a continuous address space;
   comparing the memory address of a program instruction to be executed with a reference value; and
   determining an action associated with the program instruction based on the comparison.

18. The method according to claim 17, further comprising recognizing different users having different privileges and applying different constraints to the actions associated with the program instruction according to the different privileges.

19. The method according to claim 17, further comprising a Random Access Memory (RAM) and a Read-Only Memory (ROM), the ROM being divided into a first area and second area, the method comprising:
   writing a firmware into a portion of the RAM using a Joint Test Action Group (JTAG) protocol;
   invoking an Application Programming Interface (API) stored in the second area of the ROM;
   moving, via the API, the firmware to the first area of the ROM.

20. The method according to claim 17, further comprising preventing the selection of specific test registers, the specific test registers being adapted to interface a memory component of the memory unit with a testing machine and/or external controller.

* * * * *